(12) United States Patent
Su et al.

(10) Patent No.: US 7,808,338 B1
(45) Date of Patent: Oct. 5, 2010

(54) CIRCUIT TOPOLOGY FOR MULTIPLE LOADS

(75) Inventors: Hsiao-Yun Su, Taipei Hsien (TW); Ying-Tso Lai, Taipei Hsien (TW); Shou-Kuo Hsu, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/425,394

(22) Filed: Apr. 17, 2009

(30) Foreign Application Priority Data

Apr. 3, 2009 (CN) ........................ 200910301343.0

(51) Int. Cl.
*H01P 5/04* (2006.01)
(52) U.S. Cl. ..................... 333/24 R; 333/109; 333/130; 326/86
(58) Field of Classification Search ............... 333/24 R, 333/17.3, 124; 326/30, 21, 22, 86
See application file for complete search history.

(56) References Cited

U.S. PATENT DOCUMENTS

| | | | |
|---|---|---|---|
| 5,638,402 A * | 6/1997 | Osaka et al. ................. | 375/257 |
| 6,493,394 B2 * | 12/2002 | Tamura et al. ............... | 375/257 |
| 6,686,763 B1 * | 2/2004 | Yen .............................. | 326/30 |
| 6,927,992 B1 * | 8/2005 | Yen .............................. | 365/63 |
| 6,947,304 B1 * | 9/2005 | Yen .............................. | 365/63 |
| 7,068,064 B1 * | 6/2006 | Yen .............................. | 326/30 |
| 7,126,437 B2 * | 10/2006 | Simon et al. ............... | 333/24 R |
| 7,573,353 B2 * | 8/2009 | Hsu et al. .................... | 333/125 |
| 7,649,429 B2 * | 1/2010 | Simon et al. ............... | 333/24 R |

* cited by examiner

*Primary Examiner*—Vibol Tan
(74) *Attorney, Agent, or Firm*—Zhigang Ma

(57) ABSTRACT

A circuit topology for multiple loads includes a driving terminal for transmitting a driving signal, a number of transmitting lines, and a number of loads operable to receive the driving signal from the driving terminal. The number of loads are connected to the driving terminal one by one via the number of transmitting lines. Two transmitting lines of the number of transmitting lines, which are nearest and farthest respectively from the driving terminal, are both greater than widths of the other transmitting lines.

4 Claims, 4 Drawing Sheets

CIRCUIT TOPOLOGY FOR MULTIPLE LOADS

BACKGROUND

1. Technical Field

The present disclosure relates to circuit topologies, and particularly to a circuit topology for multiple loads on a motherboard.

2. Description of Related Art

With the increasing speeds of integrated circuits (ICs), signal integrity is becoming one of the most pressing problems. Many factors, such as the parameters of the electrical elements of a printed circuit board (PCB) and the layout of the PCB, can affect the signal integrity, or lead to instability of the system, possibly even causing a system including the PCB to breakdown. Thus, preserving signal integrity has become a key point in the design of a PCB.

Referring to FIG. 3, a related-art circuit topology 80 of a system includes a driving terminal 10 coupled to six loads 20, 30, 40, 50, 60, and 70, such as integrated circuits (ICs), via corresponding transmission lines 11, 12, 13, 14, 15, and 16. The six loads 20, 30, 40, 50, 60, and 70 are connected in parallel with the driving terminal 10. In this circuit topology 80, a driving signal from the driving terminal 10 is divided into six transmitting paths to the six loads 20, 30, 40, 50, 60, and 70 respectively. Because the transmitting paths of the driving signal are not consecutive, impedances of the transmission lines 11, 12, 13, 14, 15, and 16 may not match the driving signal. Therefore, the driving signal may generate some noise signals on the transmission lines 11, 12, 13, 14, 15, and 16, which may make a voltage of the system overshoot or undershoot a standard range, and may even generate a non-monotonic phenomenon.

Referring to FIG. 4, a graph illustrating signal waveforms respectively obtained at the six loads 20, 30, 40, 50, 60, and 70 using the circuit topology 80 of FIG. 3 is shown. Some signal waveforms have non-monotonic phenomenon between 90 ns to 100 ns. The range of the actual system voltage is between −0.8V to 4V, over the standard voltage range 0V to 3.3V, which may reduce signal integrity and may damage the loads 20, 30, 40, 50, 60, and 70.

DETAILED DESCRIPTION

Figure 1:
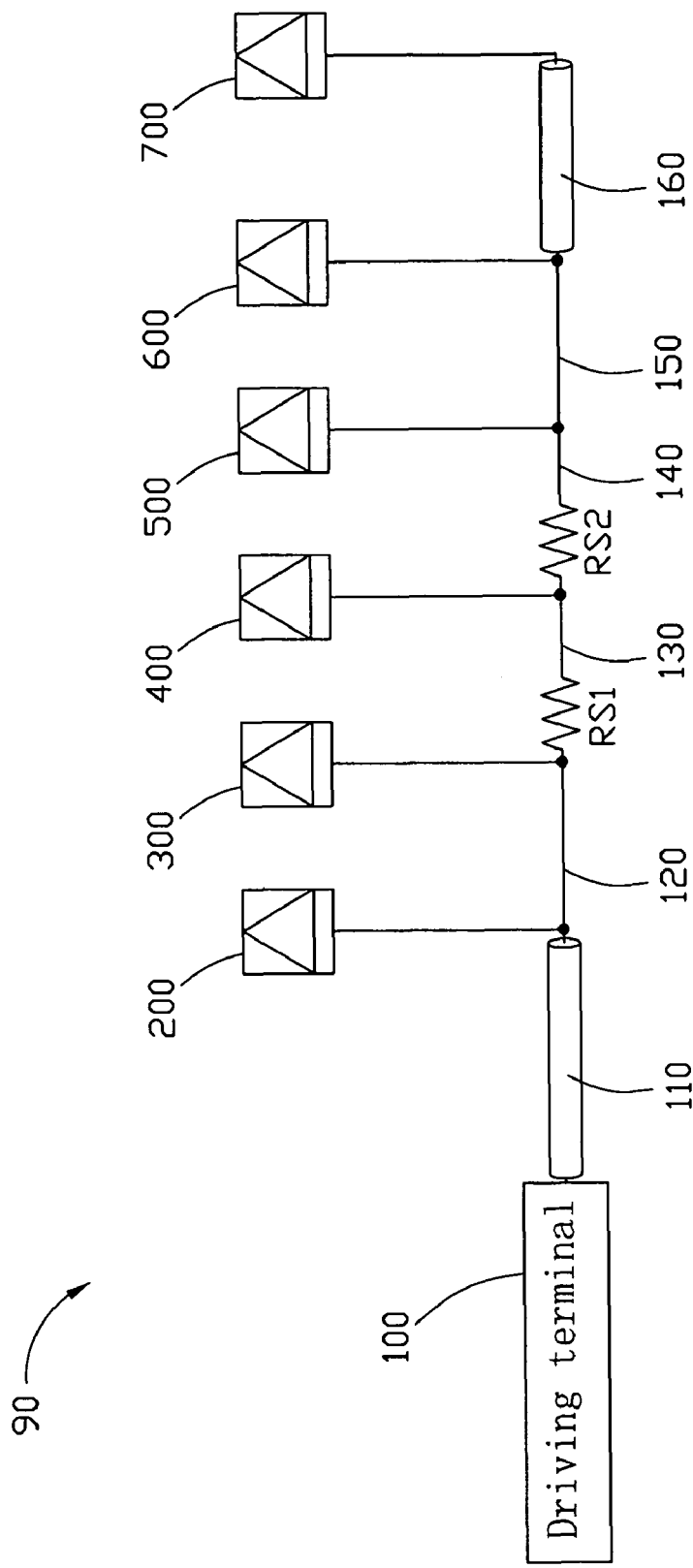
FIG. 1 is a block diagram of an exemplary embodiment of a circuit topology for multiple loads.

Referring to FIG. 1, an exemplary embodiment of a circuit topology 90 includes a driving terminal 100, six loads 200-700, two resistors RS1 and RS2, and six transmitting lines 110-160. The six loads 200, 300, 400, 500, 600, and 700 are connected to the driving terminal 100 in parallel. In other embodiments, the number of the loads and the transmitting lines can be adjusted according to requirements.

In one embodiment, widths of the transmitting lines 110 and 160 are both greater than widths of the other transmitting lines 120, 130, 140, 150. In other words, two transmitting lines 110 and 160, which are nearest and farthest from the driving terminal 100, are both greater than the other transmitting lines 120, 130, 140, 150. Because the widths of the transmitting lines 110 and 160 are increased, impedances of the transmitting lines 110 and 160 are less than impedances of the other transmitting lines 120, 130, 140, 150, therefore noise signals generated by the driving signal on the transmission lines 110, 120, 130, 140, 150, and 160 will be weaker, which can increase signal integrity of the circuit topology 90.

In one embodiment, the resistor RS1 is connected between the loads 300 and 400, and the resistor RS2 is connected between the loads 400 and 500. The resistors RS1 and RS2 can reduce non-monotonic phenomenon generated by the loads 300 and 400. Resistances of the resistors RS1 and RS2 can both be 47Ω in one embodiment, but it may be understood that the resistance value of the loads may depend on factors, such as resistance of the loads 200-700 and length of the transmitting lines 110-160, for example. In other embodiments, a resistor can be connected between every two adjacent loads to reduce non-monotonic phenomenon generated by an anterior load of the two adjacent loads.

In one embodiment, the loads 200 and 700 may be the most important loads in the loads 200-700 such as function chips, namely the nearest and farthest loads 200 and 700 from the driving terminal 100 are the most important loads. One or more of the other loads 300-600 may be less important loads such as detecting elements or connection pins. Because noise signals generated by the driving signal on the nearest and farthest loads 200 and 700 are weaker than other loads 300-600, setting the most important loads on the nearest and farthest location from the driving terminal 100 can increase signal integrity. In other embodiments, if the six loads 200-700 are the same, the six loads 200-700 can be set in any order.

Figure 2:
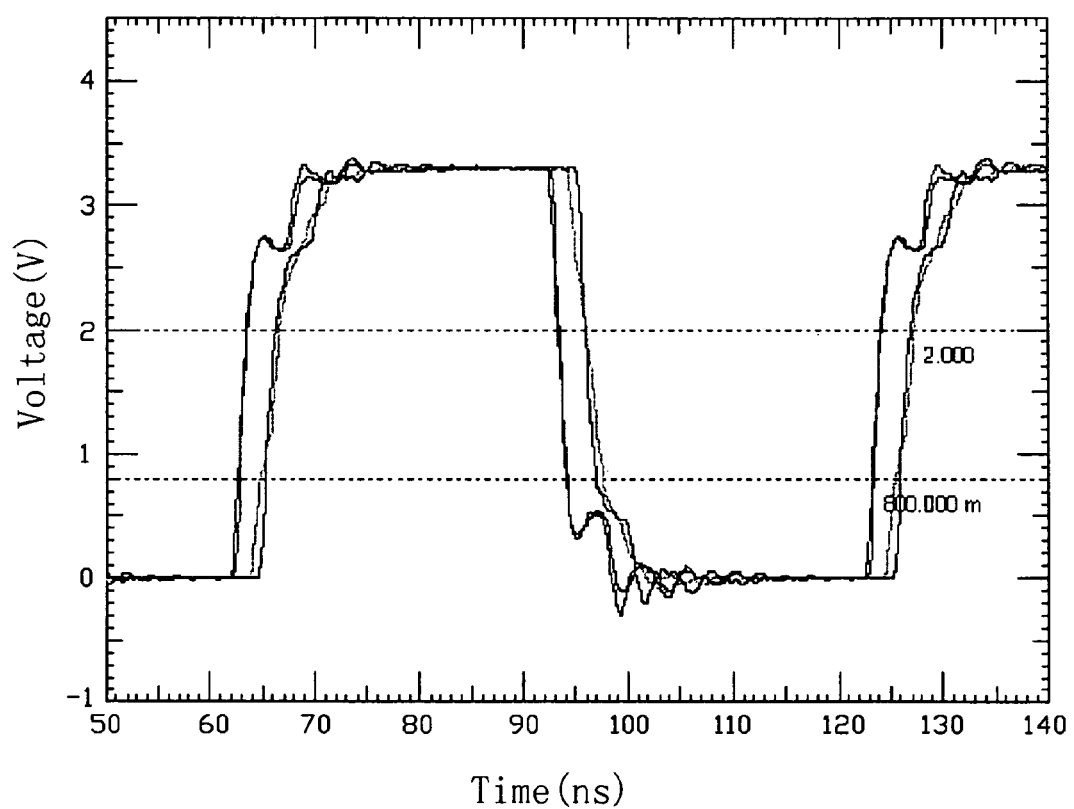
FIG. 2 is a comparative graph showing signal waveforms obtained at each signal receiving terminal using the circuit topology of FIG. 1.
Figure 3:
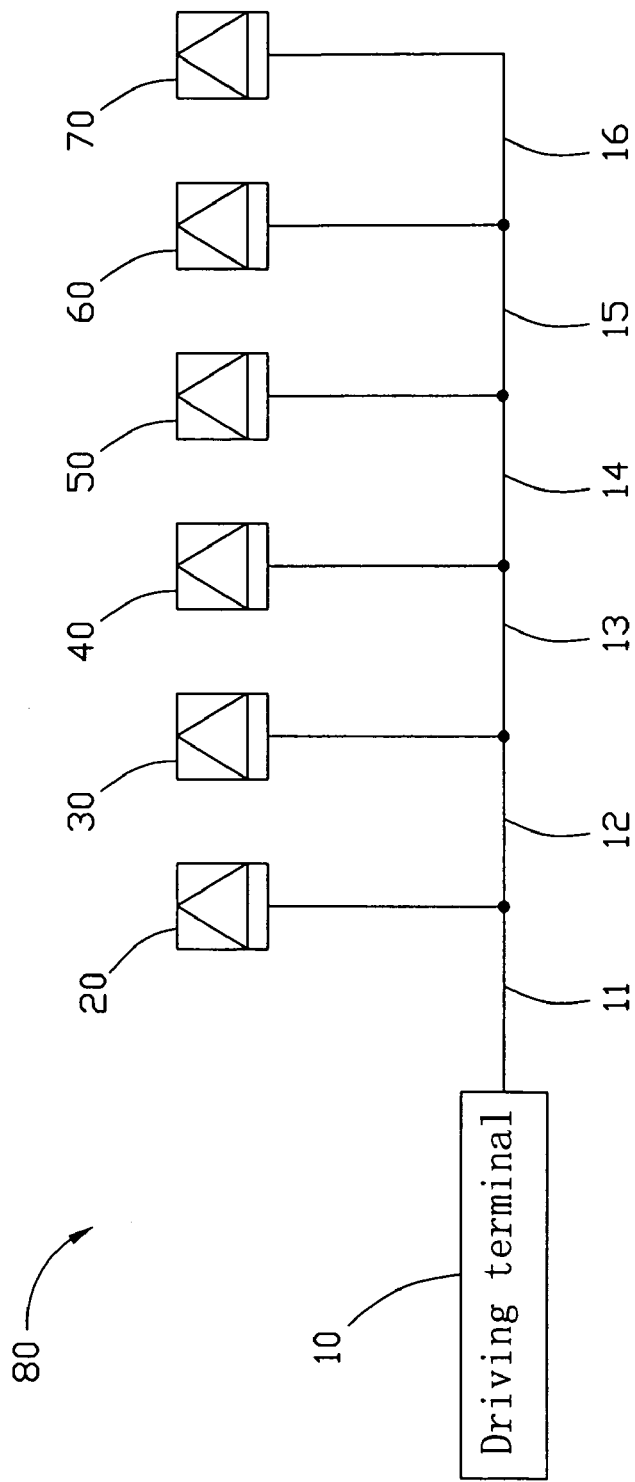
FIG. 3 is a block diagram of a related-art circuit topology for multiple loads.
Figure 4:
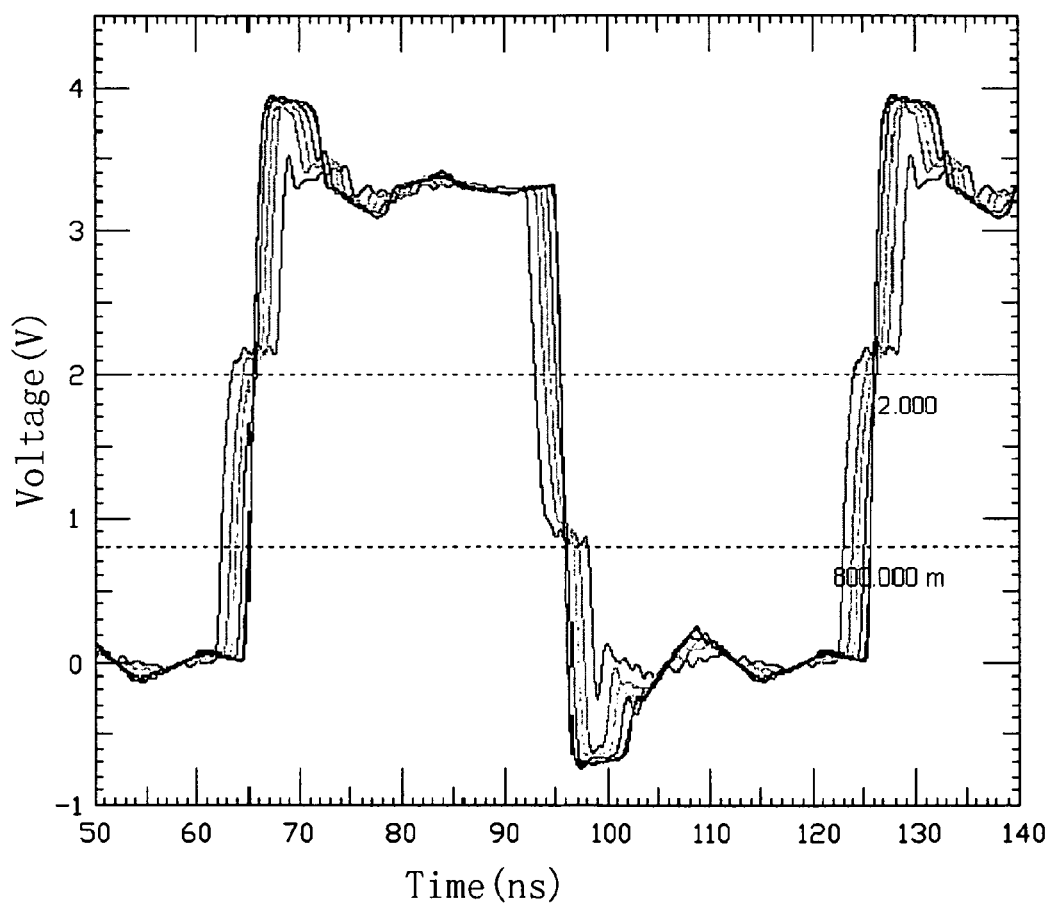
FIG. 4 is a comparative graph showing signal waveforms obtained at each signal receiving terminal using the circuit topology of FIG. 3.

Referring to FIG. 2, a graph illustrating signal waveforms respectively obtained at the six loads 200, 300, 400, 500, 600, and 700 using the circuit topology 90 of FIG. 1 is shown. There are substantially no non-monotonic phenomenon in the process of the driving signal being transmitted. The range of the actual system voltage is about between 0V to 3.3V, which is under the standard voltage range 0V to 3.3V, therefore the circuit topology 90 is very stable.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A circuit topology for multiple loads, comprising:
   a driving terminal to transmit a driving signal;
   a plurality of transmitting lines; and
   a plurality of loads operable to receive the driving signal from the driving terminal, the plurality of loads connected to the driving terminal one by one via the plurality of transmitting lines;
   wherein two of the plurality of transmitting lines, which are nearest and farthest respectively from the driving terminal, are both greater than widths of the other transmitting lines;
   wherein at least one resistor is connected between two adjacent loads, to reduce non-monotonic phenomenon generated by an anterior load of the two adjacent loads;

wherein when the number of the plurality of loads is six, a first resistor is connected between a second near load and a third near load from the driving terminal, a second resistor is connected between the third near load and a fourth near load from the driving terminal.

2. The circuit topology of claim 1, wherein resistances of the first and second resistors are both 47Ω.

3. The circuit topology of claim 1, wherein nearest and farthest loads from the driving terminal of the plurality of loads are the most important loads in the plurality of loads, and loads between the nearest and farthest loads are less important loads.

4. The circuit topology of claim 3, wherein the most important loads are function chips, and wherein the less important loads are detecting elements or connection pins.

* * * * *